(12) United States Patent
Agraharam et al.

(10) Patent No.: US 7,656,035 B2
(45) Date of Patent: Feb. 2, 2010

(54) C4 JOINT RELIABILITY

(75) Inventors: Sairam Agraharam, Phoenix, AZ (US); Carlton Hanna, Chandler, AZ (US); Dongming He, Gilbert, AZ (US); Vasudeva Atluri, Scottsdale, AZ (US); Debendra Mallik, Chandler, AZ (US); Matthew Escobido, Quezon (PH); Sujit Sharan, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/351,689

(22) Filed: Jan. 9, 2009

(65) Prior Publication Data

US 2009/0115057 A1    May 7, 2009

Related U.S. Application Data

(62) Division of application No. 11/087,180, filed on Mar. 22, 2005, now Pat. No. 7,517,787.

(51) Int. Cl.
*H01L 23/485* (2006.01)

(52) U.S. Cl. .................... 257/737; 257/738; 257/739; 257/E23.021; 438/612; 438/613

(58) Field of Classification Search ............. 257/49–52, 257/E51.005, 738, 739, E23.21, 737, E29.151
See application file for complete search history.

(56) References Cited

U.S. PATENT DOCUMENTS

| 5,793,117 A | 8/1998 | Shimada et al. |
| 6,053,395 A | 4/2000 | Sasaki |
| 6,586,843 B2 | 7/2003 | Sterrett et al. |
| 6,750,549 B1 * | 6/2004 | Chandran et al. ........... 257/780 |
| 6,869,750 B2 | 3/2005 | Zhang et al. |
| 2005/0067688 A1 | 3/2005 | Humpston |

* cited by examiner

*Primary Examiner*—Thinh T Nguyen
(74) *Attorney, Agent, or Firm*—Blakely, Sokoloff, Taylor & Zafman LLP

(57) ABSTRACT

In one embodiment, the invention provides a method comprising fabricating a die bump on a die, the die bump being shaped and dimensioned to at least reduce the flow of solder material used, to attach the die bump to a package substrate, towards an under bump metallurgy (UBM) layer located below the die bump. Advantageously, the method may comprise performing a substrate reflow operation to attach the package substrate to the die bump, without performing a separate wafer reflow operation to reflow the die bump.

4 Claims, 5 Drawing Sheets

C4 JOINT RELIABILITY

RELATED APPLICATIONS

The present divisional application is related to, incorporates by reference, and hereby claims the priority benefit of U.S. patent application Ser. No. 11/087,180, filed Mar. 22, 2005 now U.S. Pat. No. 7,517,787, assigned to the assignee of the present application.

FIELD OF THE INVENTION

Embodiments of the invention relate to flip chip (FC) technology, and in particular to the under bump metallurgy (UBM) layer of a solder joint formed during flip chip assembly.

BACKGROUND

FIG. 1 of the drawings shows the components of a solder joint 10 formed using FC technology. As will be seen, the solder joint 10 includes a solder bump 12 which is electrically connected to a metal or bond pad 14 of a semiconductor die 16. The solder joint 10 also includes an under bump metallurgy (UBM) layer 18 which serves as a wetting layer for the solder bump 12, and as a diffusion barrier to prevent the ingress of metals/solder into the semiconductor die 16, during various reflow operations including wafer reflow chip join, ball attach and mounting on motherboard Wafer reflow involves reflowing the solder bump 12 on the die to remove oxides formed on the solder bump 12 so that the bump can be attached to a substrate solder during substrate reflow. Typically, the solder bump 12 has a high-lead content, e.g., the solder bump 12 may be 90% lead (Pb) and 10% tin (Sn), and reflows at a temperature of around 330° C. During wafer reflow some of the Sn present in the die bump and reacts with the UBM layer 18.

During substrate reflow, the solder bump 12 is brought into contact with eutectic solder 20 formed on a substrate 22. Eutectic solder typically comprises about 63% Sn and 37% Pb and has a melting point of 183° C. During chip join to substrate the eutectic solder is heated to its melting point and beyond, e.g. to 220° C. During chip join reflow some of the eutectic solder 20 flows or wicks around the solder bump 12 and reacts with the UBM layer 18. More particularly, the tin from the eutectic solder 20 reacts with nickel from the UBM layer 18, thereby consuming the nickel. This degrades the UBM layer 18, a problem that is exacerbated when subsequent motherboard reflow steps are performed at temperatures between 220° C. and 270° C. At this temperature, the eutectic solder 20 wicks around the solder bump 12, in the manner described above, and reacts with the UBM layer 18 thereby consuming more of the tin in the UBM layer 18. Because the UBM layer 18 has been degraded by the consumption of the tin content therein, as described above, the UBM layer 18 eventually cracks, leading to a failure of the solder joint 10.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
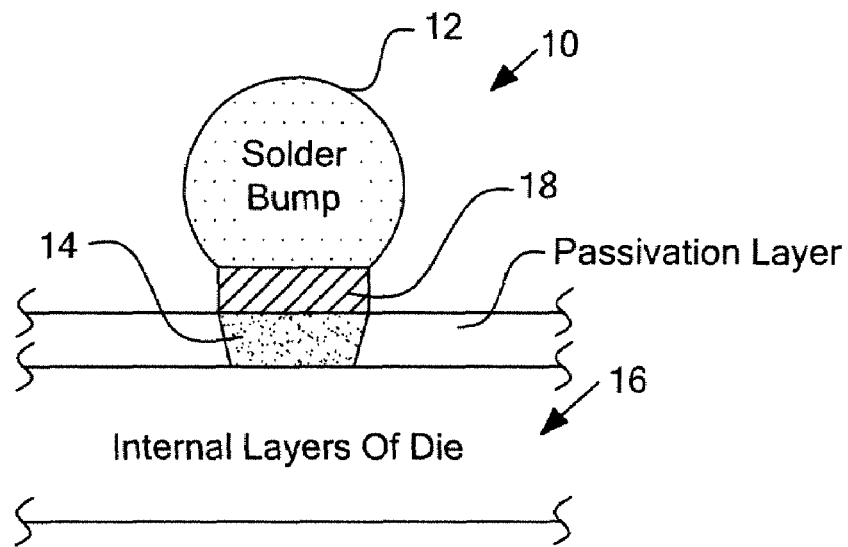
FIG. 1 shows a schematic drawing of a solder joint.
Figure 2:
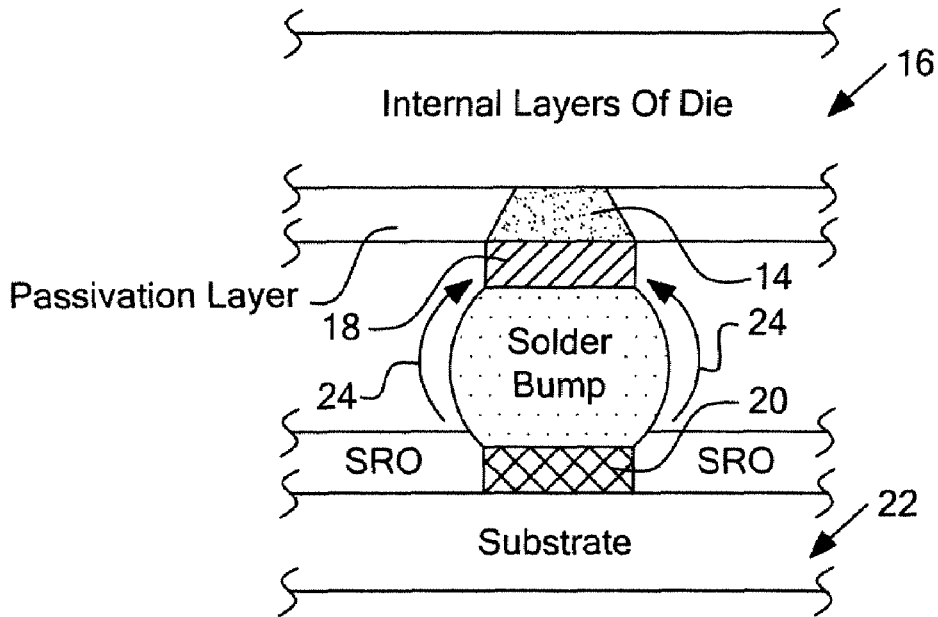
FIG. 2 shows the solder joint of FIG. 1 being attached to a substrate.
Figure 3:
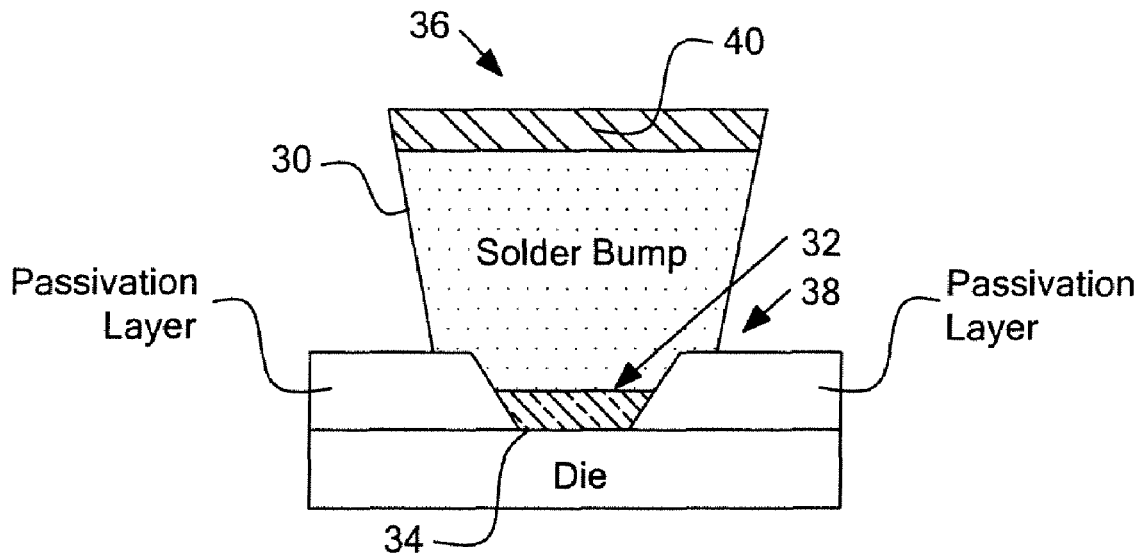
FIG. 3 shows a schematic drawing of a solder bump in accordance with one embodiment of the invention.

FIG. 3 of the drawings illustrates a solder bump 30 which is formed on a die, in accordance with one embodiment of the invention. As will be seen, the solder bump 30 extends through an opening 32 in a passivation layer formed on the die and makes contact with a UBM layer 34. The solder bump 30 has a distal end 36 which is remote from a near end 38. As will be seen, the solder bump 30 has a frusto-conical shape with the distal end 36 having a greater or wider cross-sectional area than the near end 38. Further, it will be seen that the solder bump 30 extends beyond the opening 32 in the passivation layer, which allows the solder bump to act as a barrier to prevent solder material from reaching the UBM layer 34 during substrate reflow. The solder bump 30 also includes a wetting layer 40 formed over the solder bump 30. The wetting layer 40 is of a material that acts to prevent the oxidation of the die solder bump 30 but also has good adhesion/wetting to the substrate solder. For example, in one embodiment, the wetting layer may comprise gold, cobalt, copper, or nickel, or an alloy of nickel/copper, gold and nickel.

Figure 4:
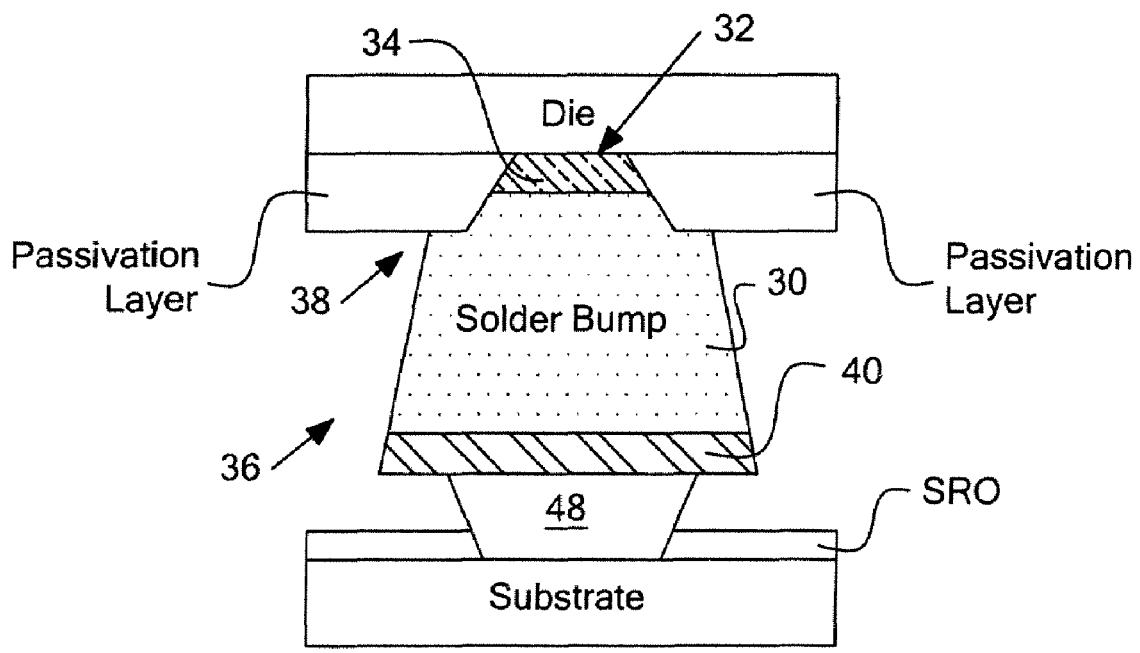
FIG. 4 shows a solder joint formed using the solder bump of FIG. 3.

FIG. 4 of the drawings shows the solder bump 30 in contact with solder bump 48 during a substrate reflow operation to form a solder joint. The wider cross-section of the distal end 36 of the solder bump 30 acts as a diffusion barrier to at least reduce the flow of the eutectic solder material from the solder bump 48 around the solder bump 30, thereby to protect the UBM layer 34 from the eutectic solder material. Further, since the near end 38 of the solder bump 30 is wider than the opening 32 in the passivation layer, the chances of the eutectic solder material making contact with the UBM layer 34 and reacting therewith is negligible.

Figure 5:
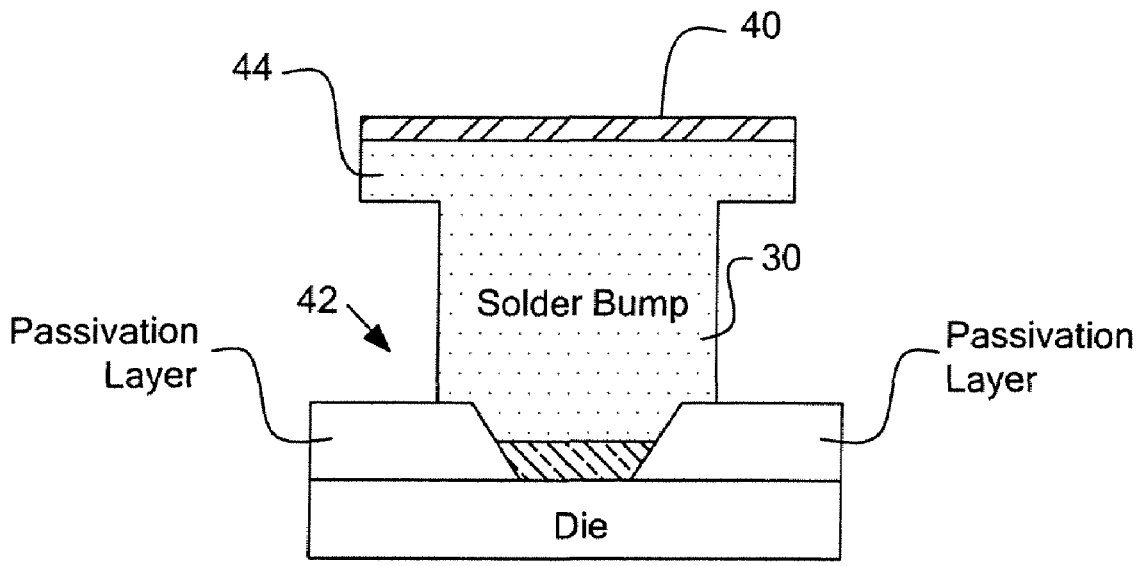
FIG. 5 shows a schematic drawing of a solder bump in accordance with another embodiment of the invention.
Figure 6:
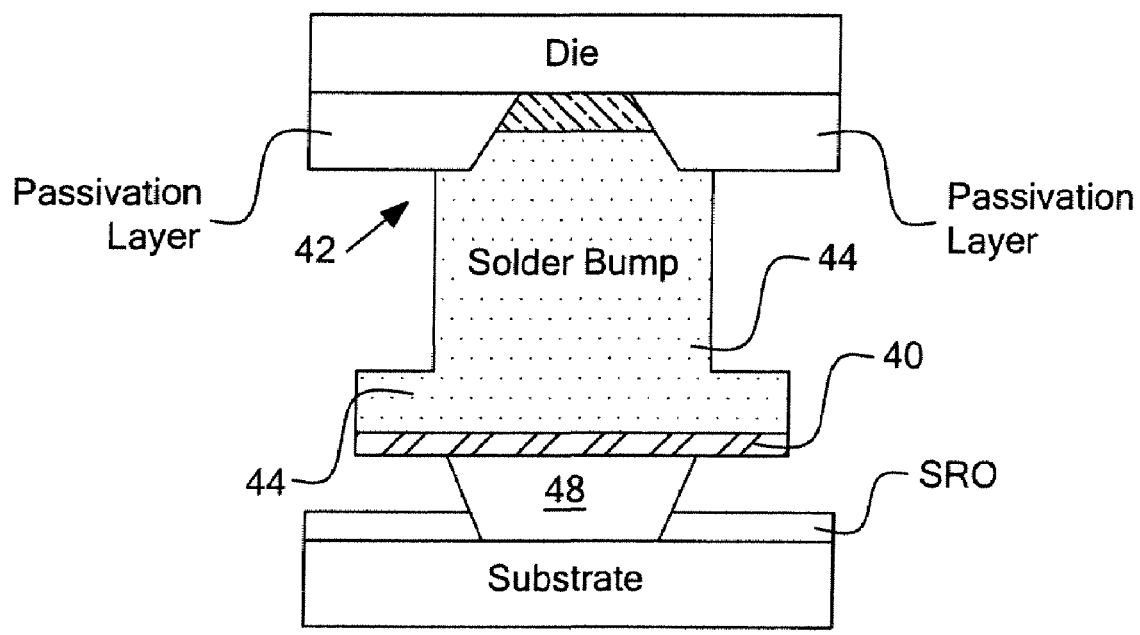
FIG. 6 shows a solder joint formed using the solder bump of FIG. 5.

Referring now to FIG. 5 of the drawings, reference numeral 42 generally indicates a solder bump in accordance with another embodiment of the invention. In FIG. 5, the same reference numerals used in FIG. 3 have been used to indicate like or similar features between the solder bumps 42 and 30. One difference between the solder bumps 42 and 30 is that instead of being frusto-conical in shape, the solder bump 42 has a generally T-shaped profile with an enlarged head 44. FIG. 6 of the drawings shows the solder bump 42 in contact with solder bump 48 during a substrate reflow operation. As will be seen, the enlarged head 44 serves to act as a barrier to prevent or at least reduce eutectic solder material from the solder bump 48 wicking around the solder bump 42 to reach the UBM layer 34.

Although only two examples of solder bumps in accordance with the invention have been shown, it is to be understood that various other shapes of solder bumps are possible. Generally, a solder bump of the present invention includes a distal end which acts as a diffusion barrier in order to prevent or at least reduce solder material wicking around the solder bump and reaching the UBM layer below the solder bump. Further, in other embodiments a near end remote from the distal end may be wider than an opening in a passivation layer within which the UBM layer 34 is formed.

Figure 7A:
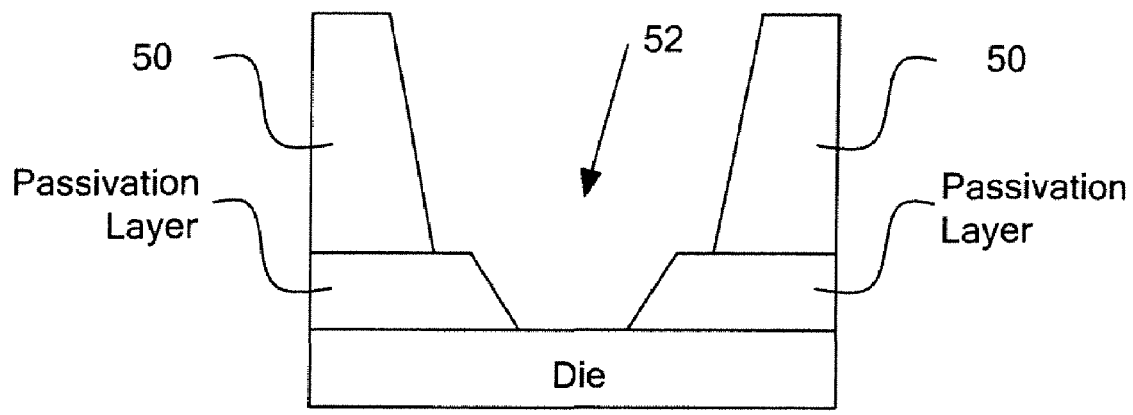
FIGS. 7 and 8 illustrate how a solder bump in accordance with the invention may be manufactured.
Figure 7B:
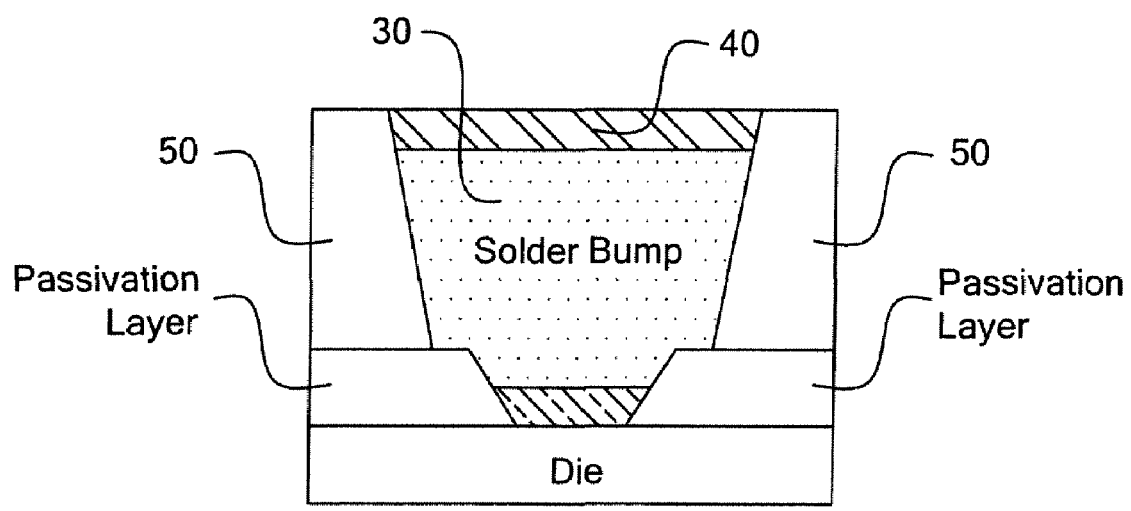

FIGS. 7A and 7B of the drawings illustrate process steps, in accordance with one embodiment of the invention, to form the solder bump 30. Referring to FIG. 7A, a photoresist material is deposited over a passivation layer formed over a die. The photoresist material 50 is patterned and developed to form an opening 52. The opening 52 has a shape that matches the shape of the solder bump 30 to be formed. FIG. 7B shows how the solder bump 30 may be formed by depositing solder material into the opening 52. Once the solder material has been deposited, the photoresist material 50 may be removed to reveal the solder bump 30.

Figure 8:
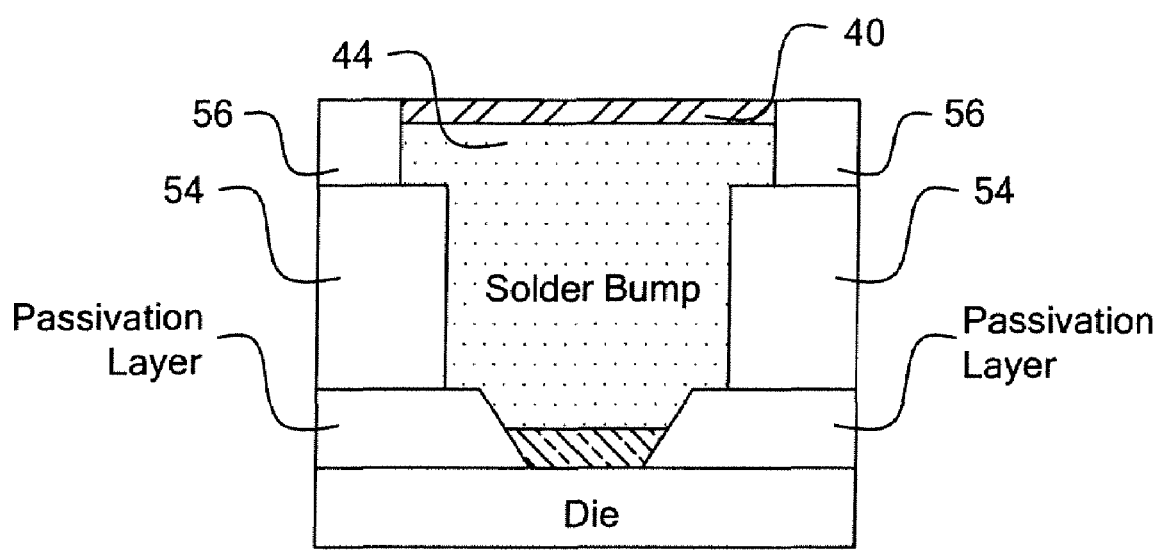

FIG. 8 of the drawings illustrates how the solder bump 42 may be manufactured in accordance with one embodiment of the invention. In the case of the solder bump 42, two separate photoresist layers 54, 56 are used. The photoresist layer 54 is patterned and developed to match the shape of a body section of solder bump 42, excluding the enlarged head 44, whereas the photoresist layer 56 is patterned and developed to match the shape of the enlarged head 44. Once the material to form the solder bump and wetting layer have been deposited, using conventional techniques, the photoresist layers 54 and 56 are removed to reveal the solder bump 42.

Because of the wetting layer 40, oxidation of the solder bumps 30 and 42 is prevented or at least reduced so that it is not necessary to perform a wafer reflow operation prior to performing the substrate reflow operations described with reference to FIGS. 4 and 6 of the drawings. Thus, one advantage of the techniques disclosed herein is that the consumption of the tin content of the UBM layer 34 during wafer reflow is avoided.

It is to be understood that the wetting layer 40 formed on the solder bumps 30 and 42 is merely optional so that in other embodiments there may be no wetting layer. In the case of embodiments that do not have a wetting layer, greater quantities of flux than normally used during substrate reflow is used in order to remove oxidation from the solder bumps 30 and 42. Thus, even in cases where the solder bumps 30 and 42 do not include a wetting layer 40, the wafer reflow step is avoided.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. An article of manufacture, comprising:
   a semiconductor die;
   a passivation layer disposed on the semiconductor die;
   an under bump metallurgy (UBM) layer formed within an opening in the passivation layer; and
   a die bump having a frusto-conical shape in contact with the UBM layer, wherein a distal end of the frusto-conical shape is located away from the UBM layer and is remote from a near end of the frusto-conical shape, the near end of the frusto-conical shape being in contact with the UBM layer and wider than the opening in the passivation layer, wherein the distal end of the frusto-conical shape has a wider cross-section than the near end of the frusto-conical shape.

2. The article of manufacture of claim 1, wherein the distal end comprises a greater cross-sectional area than the near end.

3. The article of manufacture of claim 1, further comprising a wetting layer on the die bump.

4. The article of manufacture of claim 3, wherein the wetting layer comprises a material selected from the group consisting of nickel, gold, copper, cobalt, and alloys of these metals.

* * * * *